United States Patent [19]

Tanimoto

[11] Patent Number: 4,955,023
[45] Date of Patent: Sep. 4, 1990

[54] ERROR CORRECTION CONTROL SYSTEM FOR CONTROL MEMORY

[75] Inventor: Kenzo Tanimoto, Tokyo, Japan

[73] Assignee: NEC Corporation, Tokyo, Japan

[21] Appl. No.: 164,021

[22] Filed: Mar. 4, 1988

[30] Foreign Application Priority Data

Mar. 4, 1987 [JP] Japan .................................. 62-47707
Mar. 4, 1987 [JP] Japan .................................. 62-47708

[51] Int. Cl.⁵ .......................................... G06F 11/00
[52] U.S. Cl. .................................... 371/40.1; 364/200
[58] Field of Search ................. 371/4, 12, 13, 38, 40.1

[56] References Cited

U.S. PATENT DOCUMENTS 4,641,305  2/1987  Joyce et al. ........................... 371/12
4,701,915  10/1987 Kitamura et al. ..................... 371/13

FOREIGN PATENT DOCUMENTS 0107338  5/1987  Japan .
8603634  6/1986  PCT Int'l Appl. .................. 371/38

Primary Examiner—Charles E. Atkinson
Assistant Examiner—David M. Huntley
Attorney, Agent, or Firm—Sughrue, Mion, Zinn, Macpeak & Seas

[57] ABSTRACT

An error correction control system for a control memory generates, when an error is detected in a microinstruction read out from a control memory to a microinstruction register, a first inhibit signal for inhibiting an updating the microinstruction register, and generates a second inhibit signal at the timing one clock period after the first inhibit signal is generated. After an error correction sequence is completed, the second inhibit signal is disabled at a timing one clock period after the first inhibit signal is disabled.

3 Claims, 6 Drawing Sheets

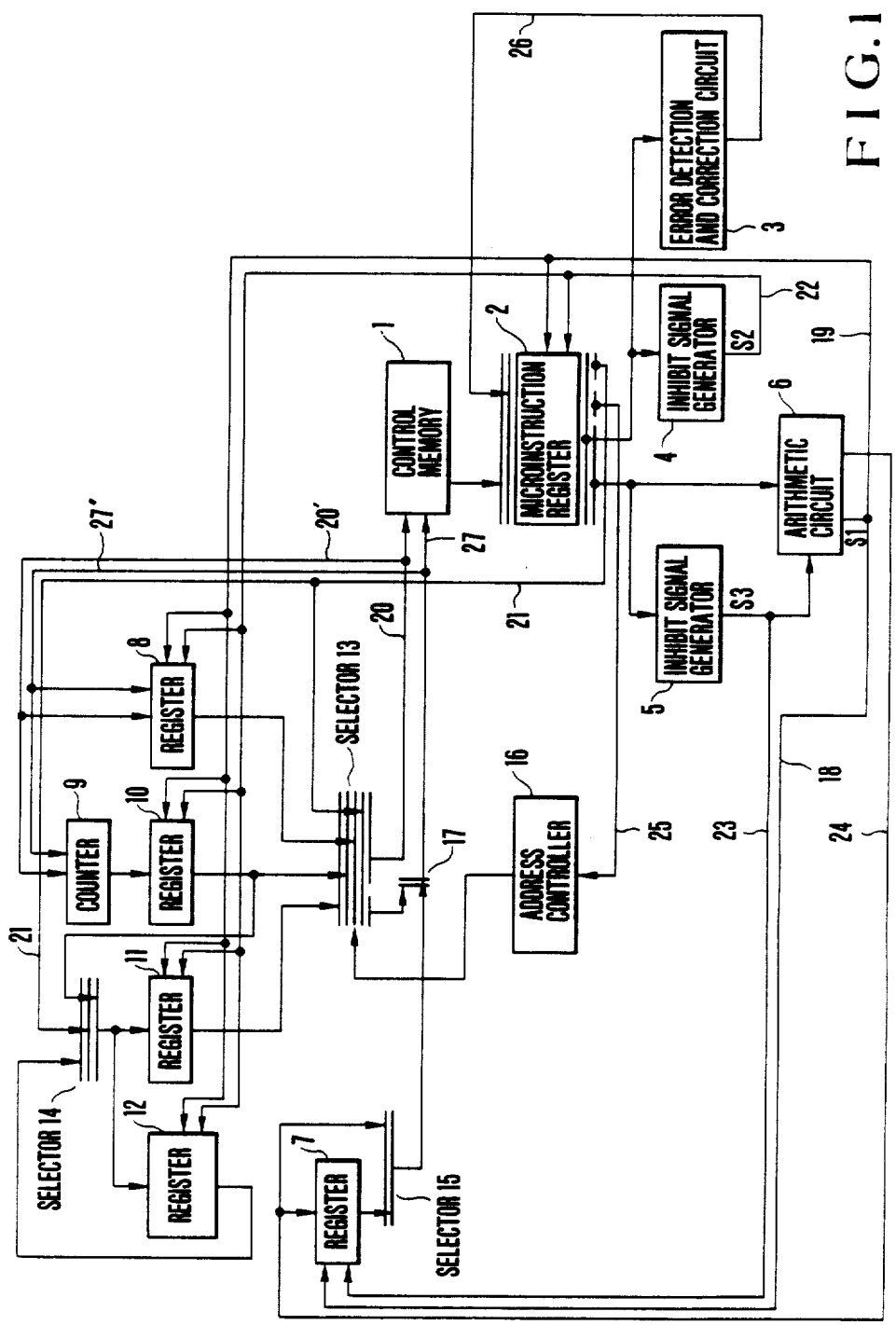
F I G. 1

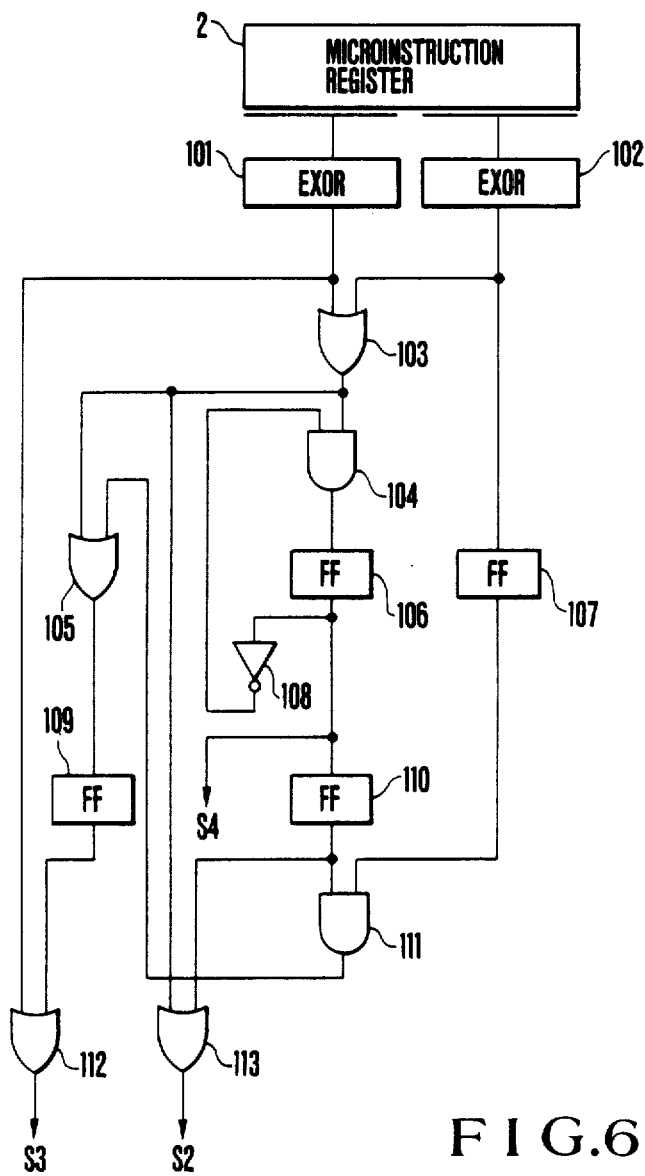
F I G. 6

ERROR CORRECTION CONTROL SYSTEM FOR CONTROL MEMORY

BACKGROUND OF THE INVENTION

The present invention relates to an error correction control system for a control memory in a microprogram-controlled data processor.

In a microprogram-controlled data processor, a plurality of microinstructions stored in a high-speed control memory are sequentially read out to a microinstruction register and then supplied to and decoded in an arithmetic circuit, thereby executing a software instruction. Each microinstruction consists of a plurality of fields containing next address information, an error correction code, and the like in addition to an operation code and data.

In a conventional error correction control system for a control memory, a correctable error is detected for all the fields of the microinstruction. In a clock cycle in which an error is detected, updating of the microinstruction register is inhibited and at the same time an operation of the arithmetic circuit is inhibited.

In general, however, since the arithmetic circuit is physically separated away from the control memory, a time required for an operation inhibit signal to reach the arithmetic circuit is increased. Therefore, a cycle or period of a clock of the microprogram-controlled data processor is undesirably limited.

SUMMARY OF THE INVENTION

It is, therefore, an object of the present invention to eliminate the above conventional drawback and to provide an error correction control system for a control memory, which can remove limitation to a cycle of a clock based on delay of an inhibit signal for inhibiting an operation of an arithmetic circuit when an error occurs.

In order to achieve the above object of the present invention, there is provided an error correction control system for a control memory in a microinstruction-controlled data processor, comprising a control memory for storing microinstructions, an address circuit for supplying an address to the control memory, a microinstruction register for storing the microinstruction read out from the control memory, an arithmetic circuit, an operation of which is controlled by the microinstruction, an error detection and correction circuit for detecting and correcting an error generated in the microinstruction stored in the microinstruction register and setting the corrected microinstruction in the microinstruction register, and inhibit signal generating means for, when the error detection and correction circuit detects the error, generating a first inhibit signal for inhibiting an updating operation of the address circuit and the microinstruction register, generating a second inhibit signal for inhibiting an operation of the arithmetic circuit at a timing one clock period after the first inhibit signal is generated, disabling the first inhibit signal after the error and correction circuit corrects the error, and disabling the second inhibit signal at a timing one clock period after the first inhibit signal is disabled.

BRIEF DESCRIPTION OF THE DRAWINGS

FIG. 1 is a block diagram of an embodiment of the present invention;

FIG. 6 is a circuit diagram of an embodiment of part of the circuit shown in FIG. 5.

DETAILED DESCRIPTION OF THE PREFERRED EMBODIMENTS

Figure 2:
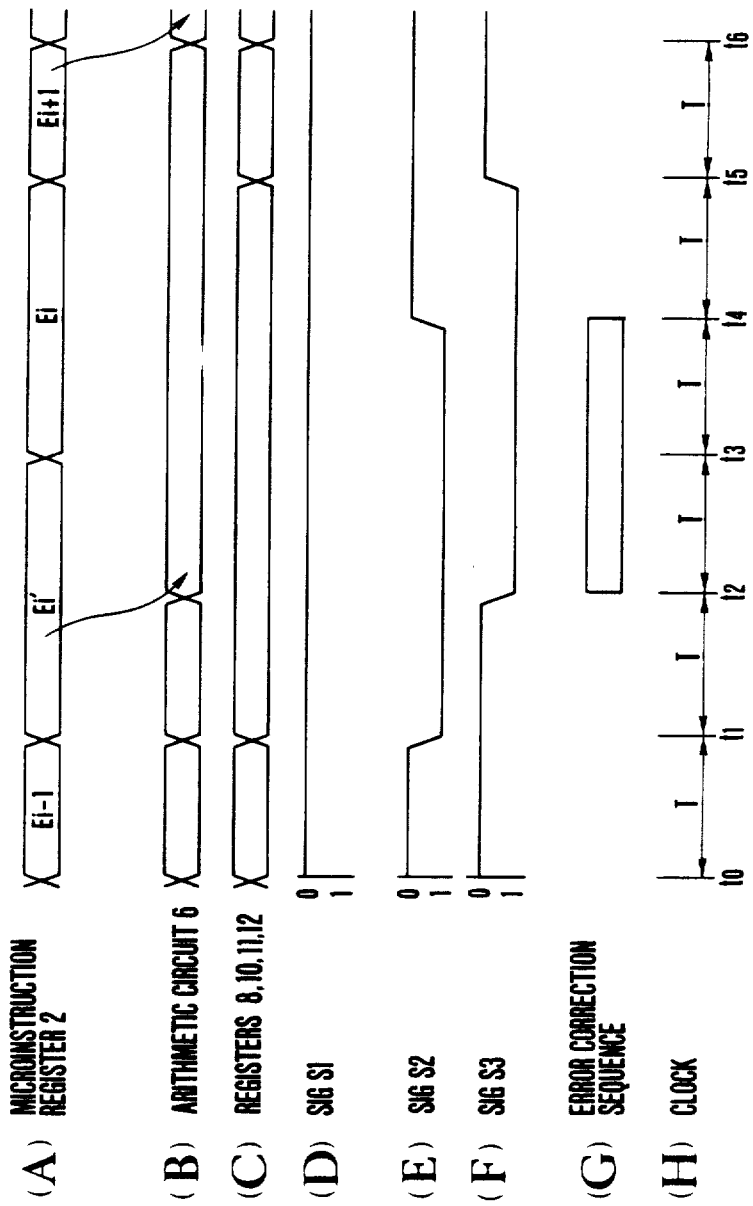
FIGS. 2(A) to 2(H) and 3(A) to 3(H) are timing charts of changes in signals and data for explaining an operation of the embodiment of FIG. 1.
Figure 3:
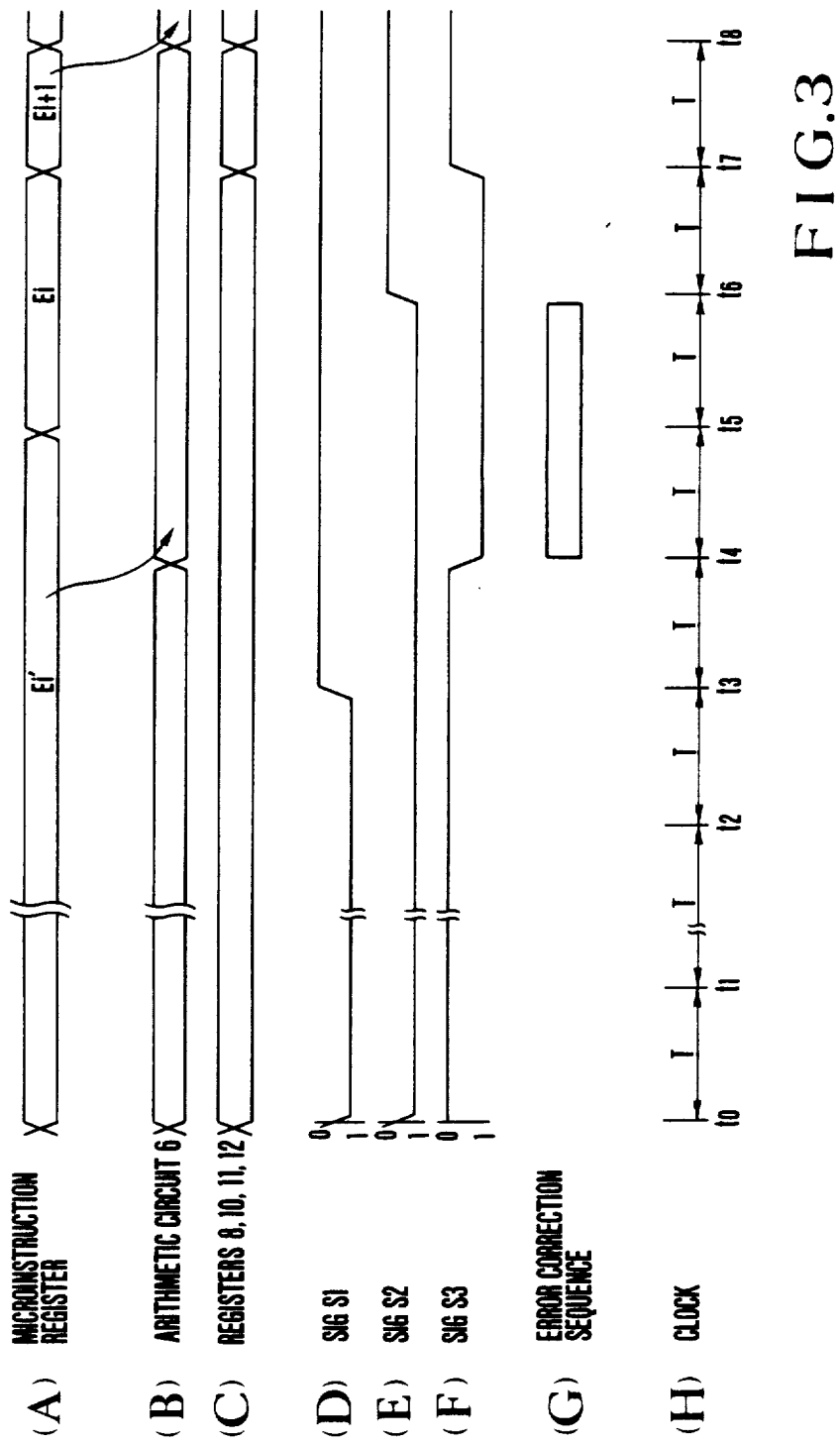

Embodiments of the present invention will be described in detail below with reference to the accompanying drawings.

FIG. 1 shows an embodiment of an error correction control system for a control memory according to the present invention.

In FIG. 1, a control memory 1 stores microinstructions each having an error correction code conforming to the Hamming code. A microinstruction register 2 includes the microinstruction read out from the control memory 1. All the fields of the microinstruction are connected to input terminals of an error detection and correction circuit 3, an inhibit signal generator 4.

A field concerning an arithmetic operation of the microinstruction register 2 is connected to an inhibit signal generator 5 and an arithmetic circuit 6. A field concerning a next address of the microinstruction register 2 is connected to an address circuit (to be described later) through a line 21. The field concerning detecting the address of the microinstruction to be executed next is connected to the address controller 16.

Registers 7, 8, 10, 11, and 12, a counter 9, and selectors 13, 14, 15, and 17 constitute an address circuit for the control memory 1 and supply an address through a line 20 to the control memory 1.

The error detection and correction circuit 3 detects and corrects an error by using an error correction code added to a microinstruction and corrects the contents of the microinstruction register 2 through a line 26.

The inhibit signal generator 4 generates an inhibit signal S2 and supplies it to the microinstruction register 2 and registers 8, 10, 11, and 12 when an error is detected as will be described later.

The inhibit signal generator 5 generates an inhibit signal S3 and supplies it to the arithmetic circuit 6 and the register 7 as will be described later.

The arithmetic circuit 6 generates an inhibit signal S1 and supplies it to the microinstruction register 2 and registers 7, 8, 10, 11, and 12 to inhibit the operation of itself and updating the microinstruction register 2 and registers 7, 8, 10, 11, and 12.

An output of the arithmetic circuit 6 is supplied to the register 7.

The register 7 receives and stores branch address information from the arithmetic circuit 6. When the register 7 receives the inhibit signal S3 from the arithmetic circuit 6 through the line 23, its updating is inhibited.

The register 8 stores a current address of the control memory 1 input through a line 20' and 27' and outputs it to the selector 13. The counter 9 increments the current address of the control memory 1 input through the line 20', and 27' by +1 and outputs it to the register 10. The register 10 stores the incremented address and outputs it to the selector 13. The register 11 stores an address selected by the selector 14 (to be described later) as a return address and outputs it to the selector 13. The register 12 stacks the output from the selector 14.

The selector 14 receives the incremented address from the register 10, the next address information contained in the microinstruction supplied from the microinstruction register 2 through the line 21, and the output from the register 12, and selects and outputs one of them to the registers 11 and 12 as a return address.

Updating the registers 8, 10, 11, and 12 and the microinstruction register 2 are inhibited by the inhibit signal S1 supplied through the line 19 or S2 supplied through the line 22.

The selector 13 is controlled by the address controller 16 to select one of the outputs from the microinstruction register 2 and the registers 8, 10, and 11, and outputs the two bits of it to one input terminal of the selector 17 and the other bits of it to the control memory 1, register 8, and counter 9. The other input terminal of the selector 17 receives the output from the selector 15. The selector 15 selects the next address information supplied from the arithmetic circuit through the line 24 or the output from the register 7 as two bits of a branch address, and supplies the address to the other input terminal of the selector 17. The selector 17 selects one of the above two inputs and outputs the selected input as two bits of the address of the control memory 1.

The microinstruction to be loaded on the microinstruction register 2 contains the information fields concerning control of an operation of the arithmetic circuit 6 (to be referred to as an A field hereinafter) and the information fields not concerning it (to be referred to as a B field hereinafter). The B field contains the next address information and information about error correction.

As shown in FIG. 1, all the fields of the microinstruction set in the microinstruction register 2 are output to the error detection and correction circuit 3, inhibit signal generator 4. The inhibit signal generator 5 and the arithmetic circuit 6 receive only the A field of the microinstruction set in the microinstruction register 2.

An operation of the circuit shown in FIG. 1 will be described below (1) When the arithmetic circuit 6 can not operate because data is not supplied, the arithmetic circuit 6 generates the inhibit signal S1 ("1") to inhibit the operation of itself and updating of the microinstruction register 2 and the registers 7, 8, 10, 11, and 12. When data is supplied, the inhibit signal S1 is disabled, and the operation of the arithmetic circuit 6 and updating of the above registers is restarted.

(2) When a correctable error in the A field is detected by the error detection and correction circuit 3, the inhibit signal generators 4 and 5 simultaneously generate the inhibit signals S2 and S3, respectively. As a result, in the clock period in which the error is detected, the operation of the arithmetic circuit 6 and updating the microinstruction register 2 and the registers 7, 8, 10, 11, and 12 are inhibited. After the error detection and correction circuit 3 finishes error correction, an error of the microinstruction in the microinstruction register 2 is corrected. As a result, the inhibit signals S2 and S3 are simultaneously disabled, and updating of the above registers is restarted.

(3) An operation to be performed when a correctable error is detected in the B field of the microinstruction by the error detection and correction circuit 3 will be described with reference to the timing charts of FIGS. 2(A) to 2(H). FIGS. 2(A) to 2(G) are commonly changed at a clock timing of a period T shown in FIG. 2(H).

When a correctable error (represented by ') is detected in the B field of the microinstruction in the microinstruction register 2 by the error detection and correction circuit 3 as shown in FIG. 2(A), the inhibit signal generator 4 generates the inhibit signal S2 ("1") at the timing t1 as shown in FIG. 2(E), and updating the microinstruction register 2 and the registers 8, 10, 11, and 12 are inhibited in a period (t1 to t2) in which the error is detected. As shown in FIG. 2(F), the inhibit signal generator 5 generates the inhibit signal S3 at a timing t2 one clock period after the inhibit signal S2 is generated, and updating the register 7 and the arithmetic circuit 6 is inhibited. At the same time, an error correction sequence is started, and the contents of the microinstruction register 2 are corrected by the error detection and correction circuit 3. After the error of the microinstruction in the microinstruction register 2 is corrected, the inhibit signal S2 is disabled ("0") at a timing t4, and the microinstruction register 2 is updated. The inhibit signal S3 is disabled ("0") at the timing t5 one clock period after the inhibit signal S2 is disabled, and an operation of the arithmetic circuit 6 is restarted.

In this case, the operation of the arithmetic circuit 6 is inhibited at the timing one clock period after updating of the microinstruction register 2 and the registers 8, 10, 11, and 12 is inhibited. Therefore, if the arithmetic circuit 6 updates a branch instruction, the branch address information supplied from arithmetic circuit 6, which is designated in accordance with the result of the operation of the arithmetic circuit 6, may be lost. Accordingly, when the arithmetic circuit 6 normally operates, the selector 15 selects a branch address supplied from the arithmetic circuit 6 through the line 24. When an error in the B field is detected, the selector 15 selects the branch address saved in the register 7. Thereafter, the microinstruction register 2 is updated by an address based on the contents of the registers 8 and 7, and then the inhibit signal S3 for the arithmetic circuit 6 is disabled to restart its operation.

(4) An operation to be performed when an error caused by the arithmetic circuit 6 and a correctable error in the B field of the microinstruction in the microinstruction register 2 are simultaneously generated will be described below with reference to the timing charts in FIGS. 3(A) to 3(H).

As shown in FIG. 3(D), when the inhibit signals S1 and S2 simultaneously go to "1" at a timing t0, a signal of "1" is supplied to the registers 2, 8, 10, 11, and 12 through the lines 19 and 22 and to the register 7 through the lines 18 and 23, thereby inhibiting updating these registers.

While a level of the inhibit signal S1 is maintained at "1", execution of the error correction sequence is inhibited. As shown in FIG. 3(D), when the inhibit signal S1 is disabled ("0") at a timing of t3, the same operation as that described with reference to FIGS. 2(A)to 2(H) is performed.

Figure 4:
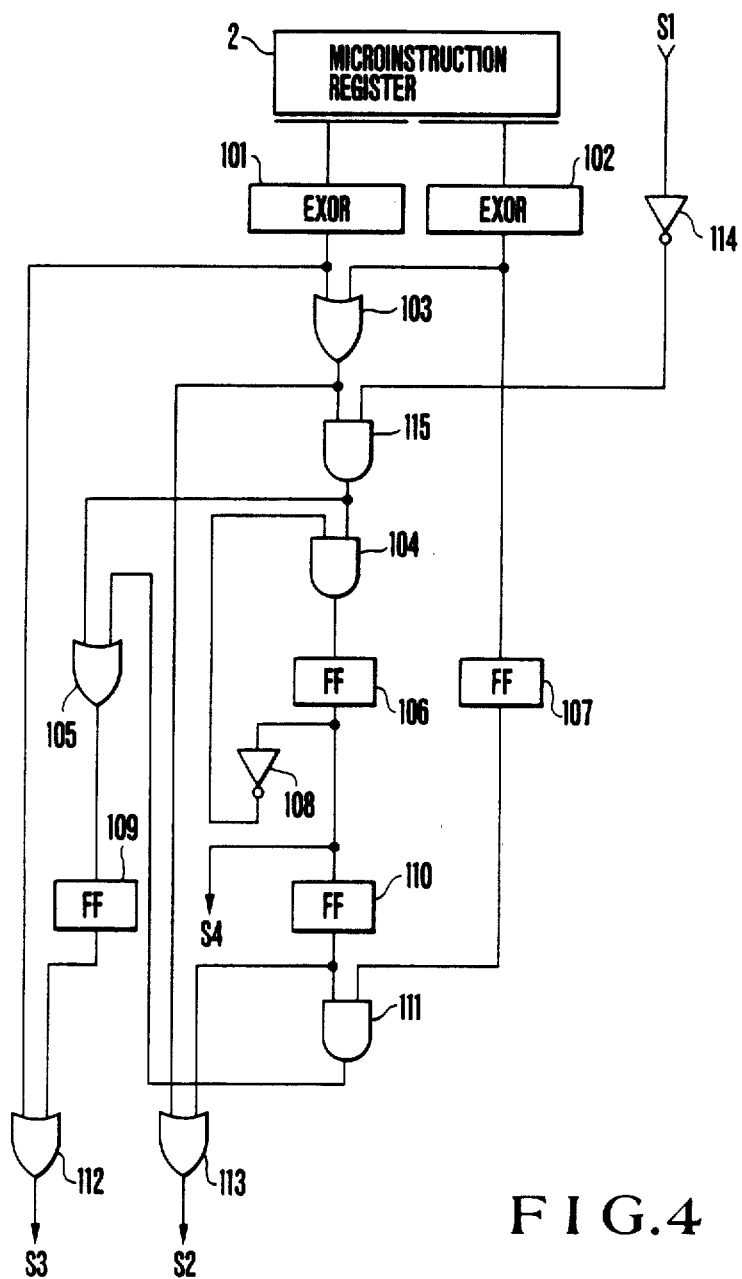
FIG. 4 is a circuit diagram of an embodiment of part of the circuit shown in FIG. 1.

FIG. 4 shows an embodiment of a circuit having functions of a part of the error detection and correction circuit 3 and the inhibit signal generators 4 and 5.

In FIG. 4, exclusive OR circuits 101 and 102 detect errors in the A and B fields of the microinstruction set in the microinstruction register 2 each, respectively. An OR gate 103 outputs "1" when an error is detected by at least one of the EXOR circuits 101 and 102. An AND gate 115 outputs "1" when an error of the microinstruction is detected while the inhibit signal S1 is not output. A flip-flop 106 is turned on during only one clock period when the AND gate 115 outputs "1". An output S4 from the flip-flop 106 is the strobe signal for the microinstruction register 2 and therefore causes the microinstruction register 2 to store the microinstruction in which an error is corrected. A flip-flop 107 is turned on when an error of the B field of the microinstruction is detected. A flip-flop 110 stores an output from the flip-flop 106. A flip-flop 109 stores the logical OR of outputs from the AND gate 115 and an AND gate 111. An OR gate 112 outputs the inhibit signal S3, and an OR gate 113 outputs the inhibit signal S2. This circuit realizes the operations shown in the timing charts of FIGS. 2 and 3 as a whole.

Figure 5:
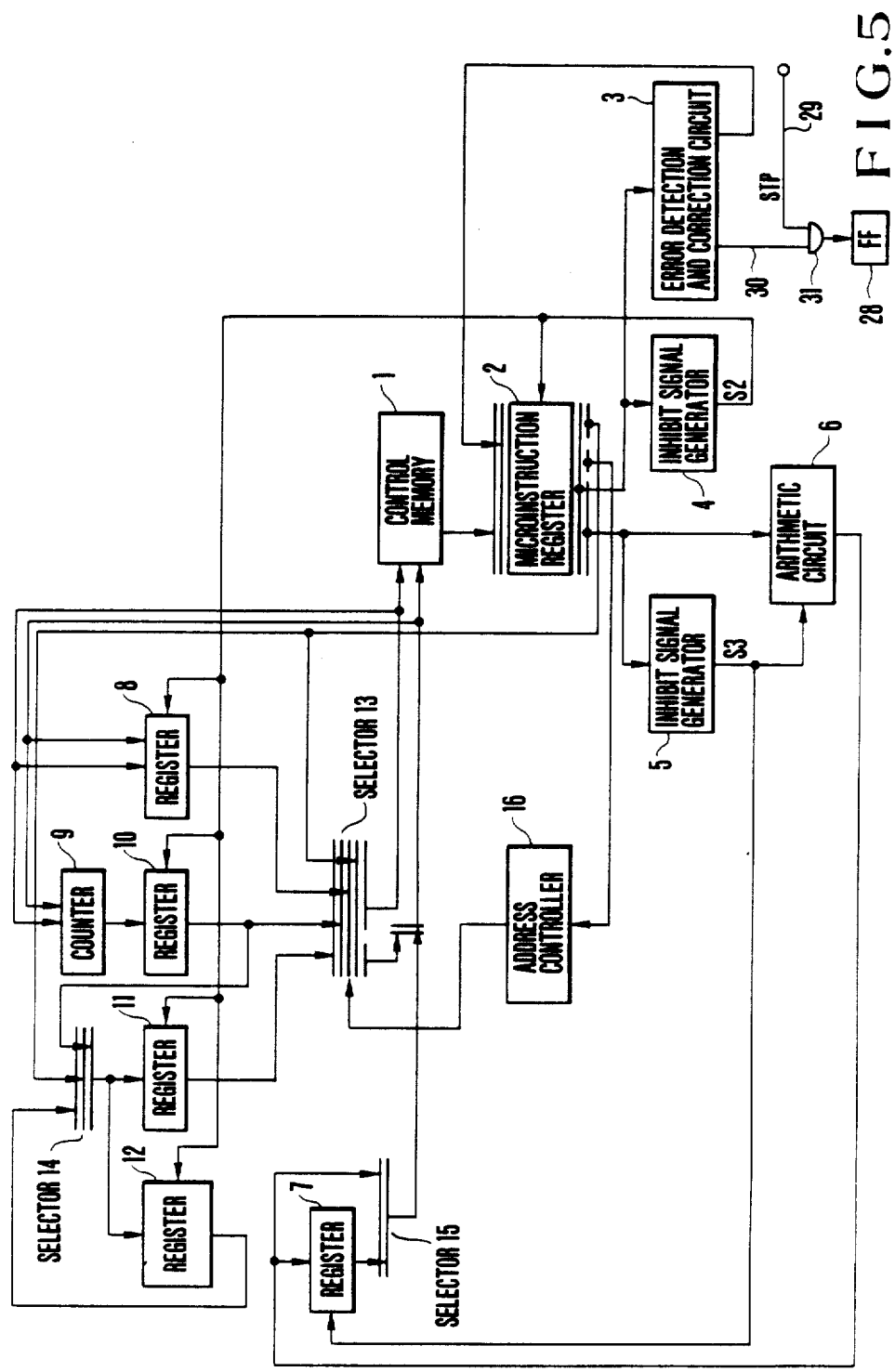
FIG. 5 is a block diagram of another embodiment of the present invention.

FIG. 5 is a block diagram showing another embodiment of the error correction control system for a control memory according to the present invention. In FIG. 4, the same reference numerals as in FIG. 1 denote the same parts, and a detailed description thereof will be omitted.

A difference between arrangements in FIGS. 4 and 1 is that circuits concerning the inhibit signal (S1 in FIG. 1) for an error caused by the arithmetic circuit 6, i.e., the connection of the inhibit signal S1 is omitted and that an error display circuit consisting of an AND gate 31 and a flip-flop 28 are connected to the error detection and correction circuit 3.

An operation of the circuit shown in FIG. 4 will be described below.

An operation to be performed when the error detection and correction circuit 3 detects an error in the A field of the microinstruction in the microinstruction register is the same as that of the circuit shown in FIG. 1.

When the error detection and correction circuit 3 detects an error in the B field of the microinstruction register, it outputs an error detection signal of "1" to one input terminal of the AND gate 31 through the line 30.

In this case, a mode of an operation differs in accordance with a level of a signal STP input to the other input terminal of the AND gate 31 through the line 29.

The signal STP is set when the system is initialized. When the signal STP is set at level "1", a stop mode for stopping the system is set.

When the signal STP is "1", an output from the AND gate 31 goes to "1", and an error indicating flip-flop 28 is set to display the error.

When the signal STP is "0", the same operation as that described with reference to the circuit of FIG. 1 is performed.

FIG. 6 shows an embodiment of a circuit having functions of a part of the error detection and correction circuit 3 and the inhibit signal generators 4 and 5.

In FIG. 6, the same parts as in FIG. 4 denote the same reference numerals and a detailed description thereof will be omitted.

A difference between FIGS. 6 and 4 is that the AND gate 115 and an inverter 114 are omitted.

As has been described above, according to the present invention, when a correctable error in the A field of the microinstruction for controlling the arithmetic circuit 6 is detected, the inhibit signal S3 for the arithmetic circuit 6 is generated in the clock period in which the error is detected. When an error in the B field of the microinstruction containing the next address information and the error correction code is detected, the inhibit signal S3 for the arithmetic circuit 6 is generated at the timing one clock period after the clock period in which the error is detected. Therefore, a delay of the inhibit signal S3 to be supplied to the arithmetic circuit 6 can be minimized. As a result, limitation of the clock period of a microprogram-controlled data processor can be prevented.

What is claimed is:

1. An error correction control system for a control memory in a microinstruction-controlled data processor, comprising:
    a control memory for storing microinstructions;
    an address circuit for supplying an address to said control memory;
    a microinstruction register in which the microinstruction read out from said control memory is set;
    an arithmetic circuit, an operation of which is controlled by the microinstruction;
    an error detection and correction circuit for detecting and correcting an error of the microinstruction set in said microinstruction register and setting the corrected microinstruction in said microinstruction register; and
    inhibit signal generating means for, when said error detection and correction circuit detects the error, generating a first inhibit signal for inhibiting an updating operation of said address circuit and said microinstruction register, generating a second inhibit signal for inhibiting an operation of said arithmetic circuit at a timing one clock period after the first inhibit signal is generated, disabling the first inhibit signal after the error detection and correction circuit corrects the error, and disabling the second inhibit signal at a timing one clock period after the first inhibit signal is disabled.

2. An error correction control system for a control memory in a microprogram-controlled data processor, comprising:
    a control memory for storing microinstructions;
    a microinstruction register in which data read out from said control memory is set;
    an arithmetic circuit, operating in accordance with the contents of said microinstruction register;
    a control circuit for determining an address of a microinstruction to be executed next in accordance with the microinstruction in said microinstruction register;
    an error detection and correction circuit for adding error correction codes to the microinstructions and storing them in said control memory, detecting and correcting an error of the microinstruction set in said microinstruction register, and setting the corrected microinstruction in said microinstruction register;
    inhibit signal generating means for, when a correctable error is detected by said error detection and correction circuit, generating a second inhibit signal for inhibiting updating said microinstruction register and a third inhibit signal for inhibiting an operation of said arithmetic circuit;
    an address save register in which an address corresponding to the microinstruction set in said microinstruction register is set; and
    a branch address save register in which branch information supplied from said arithmetic circuit is set,
    wherein when a correctable error in a field containing next address information and an error correction code of the microinstruction is detected at the same time a first inhibit signal caused by said arithmetic circuit is generated, an error correction sequence is inhibited by the first inhibit signal, the second inhibit signal is generated in a clock period in which the error is detected, the error correction sequence is begun at the same time the first inhibit signal is disabled, the third inhibit signal is generated at a timing one clock period after the second inhibit signal is generated, the second inhibit signal is disabled, and said microinstruction register is updated in accordance with the contents of said address save register and said branch address save register after the error correction sequence is completed, and then the third inhibit signal is disabled at a timing one clock period after the second inhibit signal is disabled, thereby restarting the operation of said arithmetic circuit.

3. An error correction control system for a control memory in a microprogram-controlled data processor, comprising:

a control memory for storing microinstructions;

a microinstruction register in which data read out from said control memory is set;

an arithmetic circuit, operating in accordance with the contents of said microinstruction register;

a control circuit for determining an address of a microinstruction to be executed next in accordance with the microinstruction in said microinstruction register;

an error detection and correction circuit for adding an error correction codes to the microinstructions and storing them in said control memory, detecting and correcting an error of the microinstruction set in said microinstruction register, and setting the corrected microinstruction in said microinstruction register;

inhibit signal generating means for, when a correctable error is detected by said error detection and correction circuit, generating a signal for inhibiting an operation of said arithmetic circuit;

an address save register in which an address corresponding to the microinstruction set in said microinstruction register is set;

a branch address save register in which branch information supplied from said arithmetic circuit is set; and an error indicating flip-flop for displaying an error and stopping the operation of said microprogram-controlled data processor, a mode indicating means for indicating "stop" or "correction", which is set upon the initialization of said microprogram-controlled data processor, wherein if said mode indicating means indicates "stop", when a correctable error in the field containing next address information and the error correction code of the microinstruction is detected, said error display means displays an error and stops the operation of said microprogram-controlled data processor, and if the mode indicating means indicates "correction", when the error is detected, updating said microinstruction register is inhibited in the clock period in which the error is detected and at the same time an error correction sequence is begun, the signal for inhibiting an operation of said arithmetic circuit is generated in the timing one clock period after the error is detected, said microinstruction register is updated in accordance with the contents of said address save register and said branch address save register after error correction is completed, and the signal for inhibiting the operation of said arithmetic circuit is disabled, thereby the operation of said arithmetic circuit is restarted.

* * * * *